United States Patent
Nashner et al.

(10) Patent No.: US 6,465,358 B1
(45) Date of Patent: Oct. 15, 2002

(54) POST ETCH CLEAN SEQUENCE FOR MAKING A SEMICONDUCTOR DEVICE

(75) Inventors: Michael S. Nashner, Beaverton; Bruce Beattie, Portland, both of OR (US)

(73) Assignee: Intel Corporation, Santa Clara, CA (US)

( * ) Notice: Subject to any disclaimer, the term of this patent is extended or adjusted under 35 U.S.C. 154(b) by 46 days.

(21) Appl. No.: 09/684,550

(22) Filed: Oct. 6, 2000

(51) Int. Cl.[7] .............................................. H01L 21/311
(52) U.S. Cl. .................. 438/700; 438/906; 438/963; 438/750; 438/751; 438/638
(58) Field of Search ................................. 438/598, 963, 438/906, 725, 700, 745, 749, 750, 751, 638

(56) References Cited

U.S. PATENT DOCUMENTS

| | | | | |
|---|---|---|---|---|
| 4,795,582 A | * | 1/1989 | Ohmi et al. | 252/79.3 |
| 5,449,644 A | * | 9/1995 | Hong et al. | 438/622 |
| 5,496,485 A | * | 3/1996 | Maternaghan | 252/79.3 |
| 5,686,354 A | * | 11/1997 | Avanzino et al. | 438/622 |
| 5,705,430 A | * | 1/1998 | Avanzino et al. | 438/622 |
| 5,874,201 A | * | 2/1999 | Licata et al. | 430/314 |
| 5,989,997 A | * | 11/1999 | Lin et al. | 438/622 |
| 6,042,999 A | * | 3/2000 | Lin et al. | 430/316 |
| 6,117,795 A | * | 9/2000 | Pasch | 438/745 |
| 6,191,086 B1 | * | 2/2001 | Leon et al. | 510/175 |
| 6,224,785 B1 | * | 5/2001 | Wojtczak et al. | 259/79.1 |
| 6,251,774 B1 | * | 6/2001 | Harada et al. | 438/637 |
| 6,300,235 B1 | * | 10/2001 | Feldner et al. | 438/618 |

* cited by examiner

Primary Examiner—Caridad Everhart
(74) Attorney, Agent, or Firm—Mark V. Seeley

(57) ABSTRACT

An improved method of forming a semiconductor device is described. The method comprises forming a dielectric layer on a substrate, forming a photoresist layer on the dielectric layer, then patterning the photoresist layer to define a region to be etched. After forming an etched region within the dielectric layer, the photoresist layer is removed and the etched region is cleaned. The etched region is cleaned by applying a buffered oxide etch dip, followed by an amine based dip.

17 Claims, 12 Drawing Sheets

POST ETCH CLEAN SEQUENCE FOR MAKING A SEMICONDUCTOR DEVICE

FIELD OF THE INVENTION

The present invention relates to a method for making semiconductor devices.

BACKGROUND OF THE INVENTION

Dual damascene metal interconnects may enable reliable low cost production of semiconductor devices using sub 0.25 micron process technology. Unlike conventional processes, which only require patterning of vias, processes for making dual damascene structures also require patterning of trenches that will be etched into a dielectric layer. That dielectric layer lies on top of various other layers, which may be made of metal or other materials. Those layers' varying thicknesses impart varying optical properties to the structure. As a result, when light strikes the surface, it may be reflected in a non-uniform and uncontrollable fashion. Such non-uniformity may cause the critical dimension ("CD") control across a wafer to be poor.

In addition to that substrate reflectivity problem, when the trench is formed within the dielectric layer (e.g., a silicon dioxide layer), an etch chemistry must be used that has a very high selectivity for that dielectric layer over an underlying protective layer (e.g., a silicon nitride layer). Such high selectivity is required to ensure that the protective layer prevents an underlying copper layer from being exposed to processes used to etch the trench. Unfortunately, using an etch chemistry that provides such high selectivity may adversely affect the quality of the via and trench profiles that result from the etch process.

A process has been proposed to address these issues. In that process, the via is filled with a sacrificial material prior to etching the trench. Filling the via with that material enables the trench to be etched using an etch chemistry that ensures high quality via and trench profiles, without having to consider the relative selectivity between the dielectric layer and the protective layer. That sacrificial material may be dyed or covered with an appropriate antireflective coating to produce a light absorbing background that ensures uniform reflectivity of light used to expose the photoresist during trench patterning. Examples of this process are described in copending applications Ser. Nos. 09/422,821 and 09/501,354 (filed Oct. 21, 1999 and Feb. 9, 2000, respectively, and each assigned to this application's assignee).

Although that proposed process addresses selectivity and substrate reflectivity problems, it raises a new one. Conventional photoresist ashing and trench clean processes may not adequately remove the sacrificial material used to fill the via. Accordingly, there is a need for an improved process for cleaning vias and trenches that have been etched into a dielectric layer. There is a need for such a process that allows a via to be filled with a sacrificial material prior to etching the trench, and then removed after the trench is etched. There is a need for such a process that is both manufacturable and capable of providing high yields. The post etch clean sequence of the present invention provides such a process.

DETAILED DESCRIPTION OF THE PRESENT INVENTION

Figure 1A:
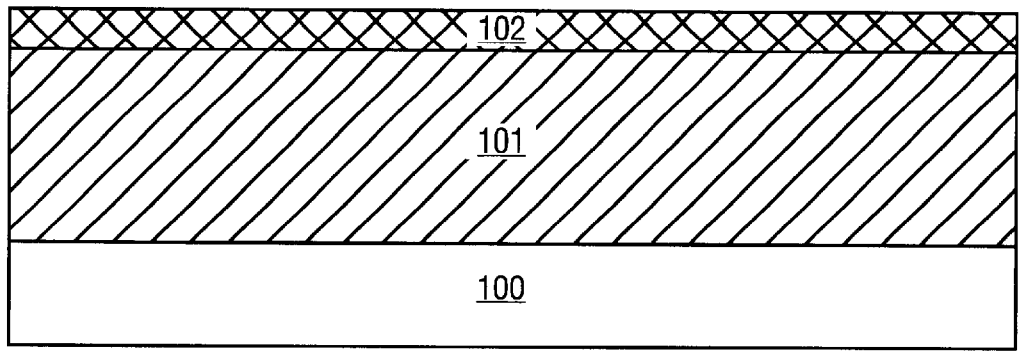
FIGS. 1a–1h illustrate cross-sections that reflect structures that may result after certain steps are used to make a copper containing dual damascene device following one embodiment of the method of the present invention.

An improved method for making a semiconductor device is described. That method comprises forming a dielectric layer on a substrate, forming a photoresist layer on the dielectric layer, patterning the photoresist layer to define a region to be etched, then forming an etched region within the dielectric layer. The photoresist layer is then removed, and the etched region is cleaned. The etched region is cleaned by applying a buffered oxide etch dip, followed by applying an amine based dip.

Set forth below is a description of a number of embodiments of the method of the present invention, presented in the context of making a device that includes a copper containing dual damascene interconnect. That description is made with reference to FIGS. 1a–1h, 2a–2g, and 3a–3c, which illustrate cross-sections of structures that result after using certain steps. Numerous details are set forth to provide a thorough understanding of the present invention. It will be apparent, however, to those skilled in the art that the invention may be practiced in many ways other than those expressly described herein. The invention is thus not limited by the specific details disclosed below.

The embodiment of the method of the present invention, which is illustrated by FIG. 1, includes the following steps. Initially, first conductive layer 101 is formed on substrate 100. Substrate 100 may be any surface, generated when making an integrated circuit, upon which a conductive layer may be formed. Substrate 100 thus may include, for example, active and passive devices that are formed on a silicon wafer such as transistors, capacitors, resistors, diffused junctions, gate electrodes, local interconnects, etc.. Substrate 100 also may include insulating materials (e.g., silicon dioxide, either undoped or doped with phosphorus (PSG) or boron and phosphorus (BPSG); silicon nitride; silicon oxy-nitride; or a polymer) that separate such active and passive devices from the conductive layer or layers that are formed on top of them, and may include previously formed conductive layers.

Conductive layer 101 may be made from materials conventionally used to form conductive layers for integrated circuits. For example, conductive layer 101 may be made from copper, a copper alloy, aluminum or an aluminum alloy, such as an aluminum/copper alloy. Alternatively, conductive layer 101 may be made from doped polysilicon or a silicide, e.g., a silicide comprising tungsten, titanium, nickel or cobalt.

Conductive layer 101 may include a number of separate layers. For example, conductive layer 101 may comprise a primary conductor made from an aluminum/copper alloy that is sandwiched between a relatively thin titanium layer located below it and a titanium, titanium nitride double layer located above it. Alternatively, conductive layer 101 may comprise a copper layer formed on underlying barrier and seed layers.

Conductive layer 101 may be formed by a chemical vapor or physical deposition process, like those that are well known to those skilled in the art. Alternatively, where copper is used to make conductive layer 101, a conventional copper electroplating process may be used. Examples of such a process are described in copending applications Ser. Nos. 163,847 and 223,472 (filed Sep. 30, 1998 and Dec. 30, 1998, respectively, and each assigned to this application's assignee). Other techniques for applying an electroplating process to form copper containing conductive layers are well known to those skilled in the art.

Although a few examples of the types of materials that may form conductive layer 101 have been identified here, conductive layer 101 may be formed from various other materials that can serve to conduct electricity within an integrated circuit. Although copper is preferred, the use of any other conducting material, which may be used to make an integrated circuit, falls within the spirit and scope of the present invention.

After forming conductive layer 101 on substrate 100, barrier layer 102 is formed on conductive layer 101. Barrier layer 102 will serve to prevent an unacceptable amount of copper, or other metal, from diffusing into dielectric layer 103. Barrier layer 102 also acts as an etch stop to prevent conductive layer 101 from being exposed to subsequent via and trench etch and clean steps. Barrier layer 102 preferably is made from silicon nitride, but may be made from other materials that can serve such functions, e.g., titanium nitride or oxynitride, as is well known to those skilled in the art.

When formed from silicon nitride, a chemical vapor deposition process may be used to form barrier layer 102. Barrier layer 102 should be thick enough to perform its diffusion inhibition and etch stop functions, but not so thick that it adversely impacts the overall dielectric characteristics resulting from the combination of barrier layer 102 and dielectric layer 103. To balance these two factors, the thickness of barrier layer 102 preferably should be less than about 10% of the thickness of dielectric layer 103.

Conductive layer 101 and barrier layer 102 may be planarized, after they are deposited, using a CMP step. FIG. 1a illustrates a cross-section of the structure that results after conductive layer 101 and barrier layer 102 have been formed on substrate 100.

Dielectric layer 103 is then formed on top of barrier layer 102. Dielectric layer 103 preferably comprises silicon dioxide, which is deposited on the surface of barrier layer 102 using a conventional plasma enhanced chemical vapor deposition (PECVD) process that employs tetraethylorthosilicate (TEOS) as the silicon source. Although preferably made of silicon dioxide, dielectric layer 103 may be made from other materials that may insulate one conductive layer from another, as will be apparent to those skilled in the art. For example, dielectric layer 103 may comprise fluorinated silicon dioxide or a porous silicon dioxide, e.g., silicon dioxide doped with carbon. Dielectric layer 103 preferably has a thickness of between about 2,000 and about 20,000 angstroms.

Figure 1B:
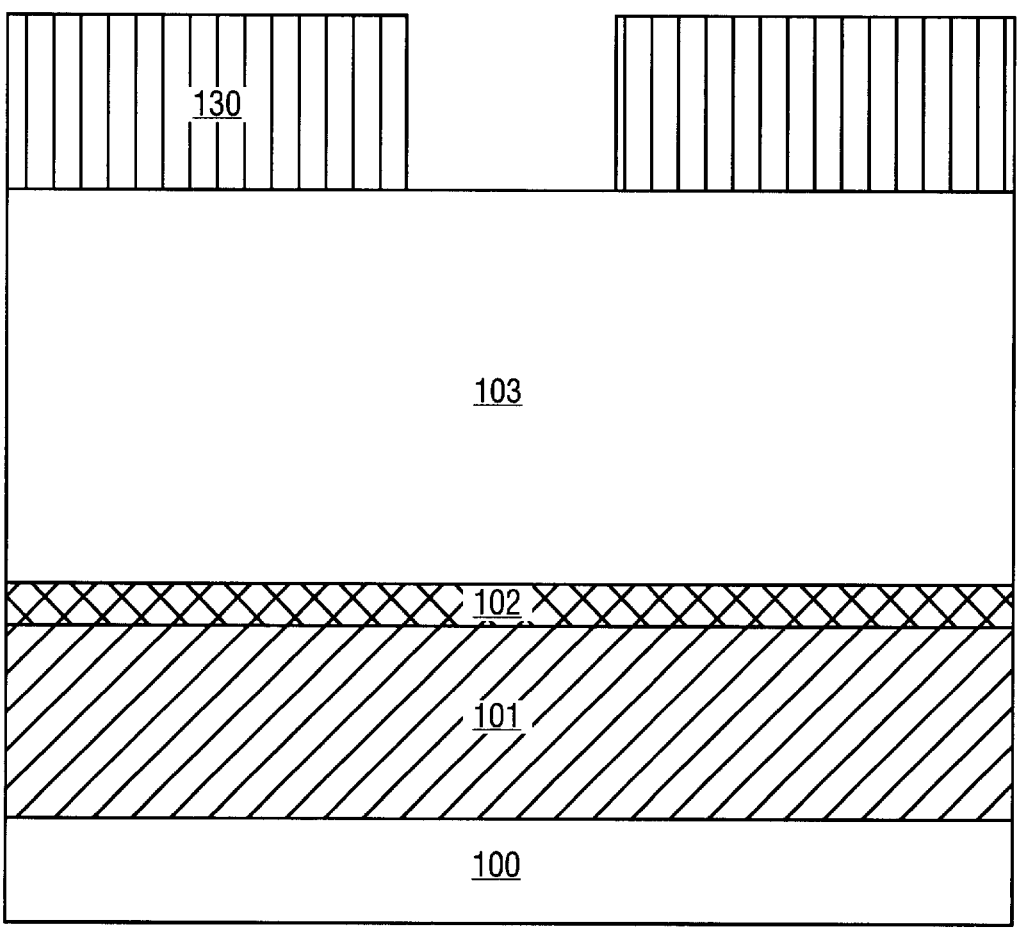
Figure 1C:
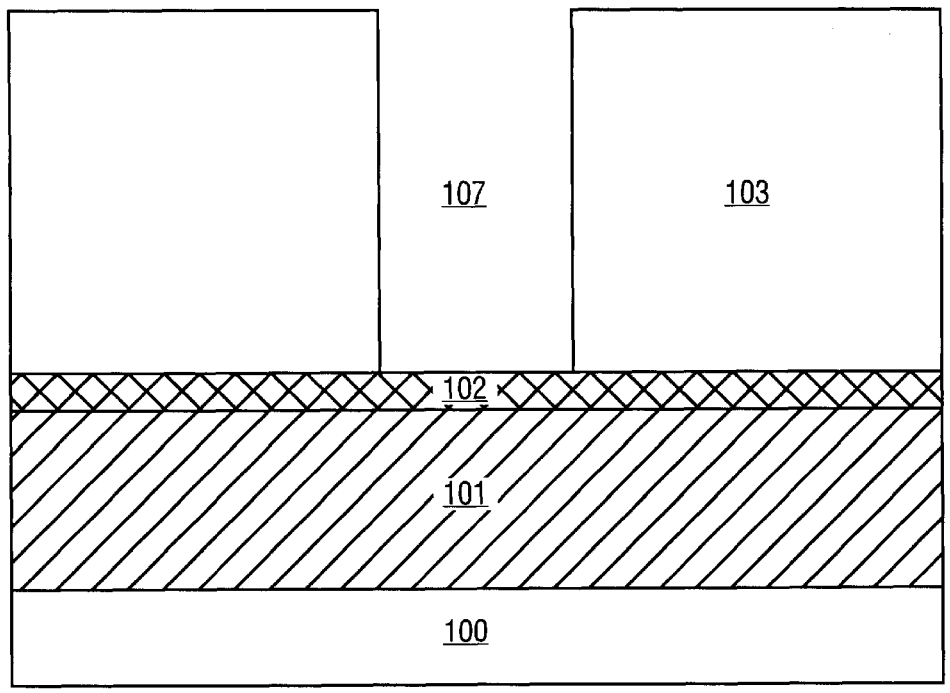

After forming dielectric layer 103, a photoresist layer 130 is patterned on top of it to define a via formation region for receiving a subsequently formed conductive layer that will contact conductive layer 101. Photoresist layer 130 may be patterned using conventional photolithographic techniques, such as masking the layer of photoresist, exposing the masked layer to light, then developing the unexposed portions. The resulting structure is shown in FIG. 1b.

After photoresist 130 is patterned, via 107 is etched through dielectric layer 103 down to barrier layer 102. Conventional process steps for etching through a dielectric layer may be used to etch the via, e.g., a conventional anisotropic dry oxide etch process. Such a process may employ a medium density magnetically enhanced reactive ion etching system ("MERIE system") that uses fluorocarbon chemistry.

Barrier layer 102 acts as an etch stop to protect conductive layer 101 from exposure to process steps used to etch and clean vias and trenches. Because of nonuniformity in the thickness of dielectric layer 103, and oxide etch variability, an overetch step may be necessary. Such an overetch step may consume about 20–30% of barrier layer 102. Conventional post etch ashing and via clean steps may follow the via etch step to produce the structure shown in FIG. 1c. Via 107 may be cleaned by using a conventional HF in ethylene glycol based wet etch process, as is well understood by those skilled in the art.

Figure 1D:
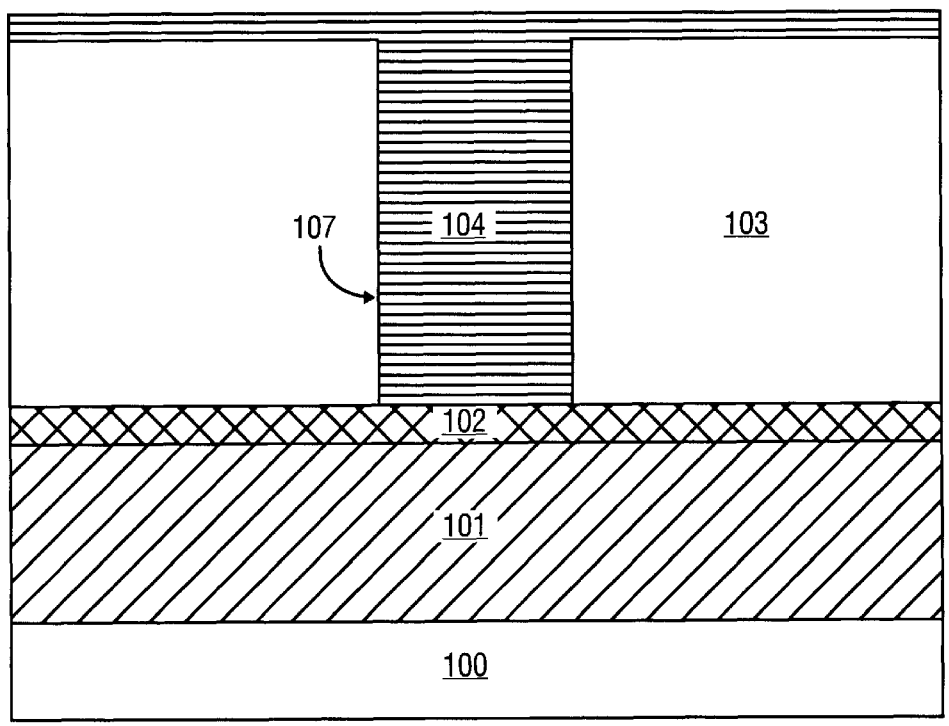

After via 107 is formed through dielectric layer 103, via 107 is filled with sacrificial material 104, generating the structure shown in FIG. 1d. Sacrificial material 104 has dry etch properties similar to those of dielectric layer 103. Preferably, sacrificial material 104 comprises a spin-on-glass (SOG) that is deposited by spin coating between about 500 and about 3,000 angstroms of the material onto the surface of the device, using conventional process steps. Although only a thin layer remains on the surface of the device, such a spin coating process causes sacrificial material 104 to substantially, or completely, fill via 107. In this embodiment of the present invention, sacrificial material 104 preferably should etch at a slightly faster rate than dielectric layer 103, when subjected to the chosen dry etch chemistry.

In addition to having dry etch properties like those of dielectric layer 103, sacrificial material 104 should uniformly fill via 107 and have a wet etch rate that is significantly faster than the wet etch rate for dielectric layer 103. Such dry etch properties should enable removal of a substantial portion of the sacrificial material from the bottom of the via by the end of the trench etch process. The uniform fill characteristic minimizes void formation, which could jeopardize the integrity of the filling and/or may expose the underlying silicon nitride layer, for an undesirable extended period of time, to etch chemistry used to form the trench. The selectivity of sacrificial material 104 to the wet etch enables removal of that material from the surface of the device, as well as from inside via 107.

When sacrificial material 104 is transparent, high substrate reflectivity (and reflectivity variation across devices), which results during the exposure step of the lithographic process used to define the trench, may adversely affect the ability to control CDs and their uniformity. That effect may become more pronounced as those CDs shrink.

Using a dyed SOG for sacrificial material 104 should enable control of such substrate reflectivity. By dying such a base material with certain organic or inorganic substances, that base material may become opaque. By using a dyed base material for sacrificial material 104, changes in substrate reflectivity may be reduced, which may enable the photolithographic process to produce improved results. The organic or inorganic material chosen for the dye preferably should absorb light that is used during the exposure step of the photolithographic process. Preferably, the quantity and type of light absorbing dye, which is added to the base sacrificial material, should enable appreciable absorption of light having a wavelength identical to that used to expose the photoresist to pattern it. For example, the dye type and amount, and the type of base material, used to form the sacrificial material may be selected and tuned to absorb i-line (e.g., 365 nm), deep ultraviolet (e.g., 248 nm and 193 nm), or shorter, wavelengths.

When selecting the type of dye to add to the SOG, or other sacrificial material, and the amount to add, one should ensure that the resulting composition does not compromise the filling capability of the sacrificial material. In addition, when selecting the kind of dye used, and the amount used, one should ensure that the wet etch selectivity of the resulting dyed sacrificial material to the dielectric layer remains high, and that the dry etch selectivity of the sacrificial material to the dielectric layer is close to 1:1.

Figure 1E:
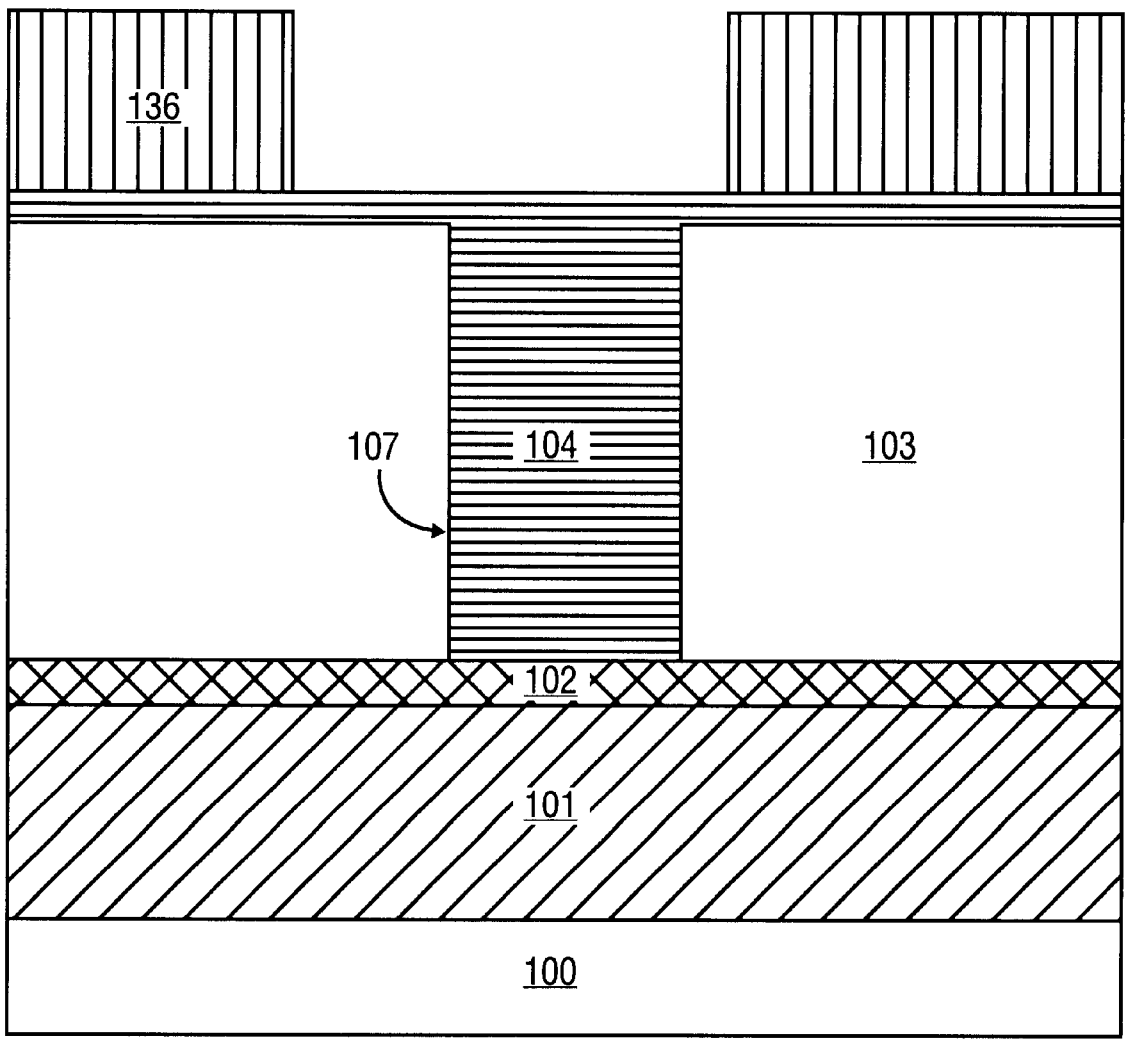

After filling via 107 with sacrificial material 104, photoresist layer 136 is applied on top of layer 104, then patterned to define a trench formation region. Photoresist layer 136 may be patterned using conventional photolithographic techniques. The resulting structure is shown in FIG. 1*e*. Following that photoresist patterning step, trench 106 is etched into dielectric layer 103 to form the structure shown in FIG. 1*f*.

The etching process is applied for a time sufficient to form a trench having the desired depth. The etch chemistry chosen to etch trench 106 preferably should remove sacrificial material 104 at a slightly faster rate than it removes dielectric layer 103, to avoid formation of defects. Trench 106 may be etched using the same equipment and etch chemistry that had been used previously to etch via 107. As with the via etch step, barrier layer 102 may act as an etch stop during the trench etching process, protecting the underlying conductive layer from the etch step and any subsequent ashing or cleaning steps. In addition, the presence of any portion of sacrificial material 104 that remains at the bottom of via 107 after the trench etch step may help ensure that conductive layer 101 will not be affected by the trench etch process.

By filling via 107 with a sacrificial material having dry etch characteristics like those of dielectric layer 103, the trench lithography process applies, in essence, to a substantially "hole-free" surface—similar to one without vias. By selecting an appropriate SOG material for sacrificial material 104, and an appropriate etch chemistry, trench 106 may be etched into dielectric layer 103 at a rate that is almost as fast as sacrificial material 104 is removed. Such a process protects the underlying barrier layer 102 during the etching of trench 106. Such a process thus permits the use of a trench etch chemistry that produces superior trench and via profiles without having to consider the effect such etch chemistry has on the selectivity between dielectric layer 103 and barrier layer 102.

For example, when dielectric layer 103 comprises silicon dioxide and barrier layer 102 comprises silicon nitride, an etch chemistry may be used to etch the trench that does not provide a high selectivity of silicon dioxide to silicon nitride. In addition, because filling via 107 with a sacrificial material enables a reduction in the amount of time during which barrier layer 102 is etched during the trench etch process, the thickness of barrier layer 102, e.g., a silicon nitride layer, when initially deposited, may be reduced to less than about 600 angstroms.

When a dyed base material is used for sacrificial material 104, the lithography subsequently used to pattern lines and spaces may be improved by reducing the amount of substrate reflectivity. This ensures that substrate reflectivity will be more uniform and controllable, which enables better CD control. Better CD control should enable use of sub 0.25 micron processes to make integrated circuits with dual damascene structures.

Filling the via with a sacrificial material prior to the trench etch step thus provides a number of benefits. First, it allows for improved lithographic performance for defining line and space patterns. Second, it allows for the use of an etch chemistry that enables vias and trenches with improved, substantially vertical, profiles to be formed—without regard to selectivity of the dielectric layer to the underlying barrier layer. In addition, by enabling use of a thinner barrier layer than might otherwise be required, the method of the present invention may enable the making of a device having improved dielectric properties.

After trench 106 is etched, photoresist 136 and residues, which may remain on the device's surface and inside the vias—including those portions of sacrificial material 104 that remain after the trench etch process, must be removed. Photoresist 136 may be removed using a conventional oxygen based ashing process. Such a process removes the remaining photoresist and oxidizes a significant part of the organic content of the remaining portions of sacrificial material 104. Any conventional photoresist removal apparatus may be used, e.g., those available from Gasonics. In a preferred embodiment of the present invention, the oxygen based ashing process should be applied for less than about 2 minutes, more preferably less than about 90 seconds, and even more preferably between about 40 seconds and about 80 seconds.

The ashing process oxidizes sacrificial material 104 from top down. The amount of material oxidized depends upon the temperature that is applied during the ashing step. That temperature increases during the ashing process because the heating lamp used in the photoresist removal apparatus causes the temperature to rise with time. Although oxidation increases with temperature, the rate of oxidation may decrease significantly after the temperature reaches a given threshold. At that point, continuing to increase the temperature, e.g., by continuing to operate the apparatus, may not significantly affect further oxidation of sacrificial material 104. As a consequence, regardless of how long the photoresist removal apparatus is operated, some portion of sacrificial material 104 will remain unoxidized. That circumstance, in addition to the fact that it is impractical for a manufacturing process to operate that equipment for an excessively long time period, motivated applicants to develop the clean sequence of the present invention.

After the ashing step oxidizes a substantial portion of sacrificial material 104, the method of the present invention applies a wet etch clean process to remove both the oxidized and unoxidized portions of that material. That wet etch process comprises applying a buffered oxide etch ("BOE") dip followed by applying an amine-based dip. When dielectric layer 103 comprises silicon dioxide and sacrificial material 104 comprises SOG, the BOE step preferably comprises dipping the device into a conventionally used BOE solution. Such a BOE dip provides a selective wet etch process that removes the oxidized portion of the sacrificial material (e.g., SOG) at a much higher rate than the dielectric layer.

The BOE dip preferably should be applied for at least about 30 seconds, and more preferably between about 2 minutes and about 3 minutes. The appropriate duration may depend upon the amount of material to be removed. When relatively large quantities of material must be removed, a longer dip may be preferred; whereas, when relatively small quantities of material must be removed, a shorter dip may be preferred. Because the etch rate is proportional to the concentration of the BOE solution, a less concentrated solution (e.g., a 500:1 BOE solution) may be preferred when removing small amounts of material, while a solution with a higher concentration (e.g., a 50:1 BOE solution) may be preferred when larger amounts of materials are removed. Although these guidelines may be appropriate for most situations, time and concentration should be balanced to ensure that removal occurs at an acceptable rate without etching a significant portion of the dielectric layer. For example, it may be appropriate to lengthen the dip time and reduce the solution's concentration, when removing small quantities of sacrificial material, to ensure that the process will not remove much of the dielectric layer.

Although that BOE dip removes the oxidized portion of sacrificial material 104, the remaining unoxidized portions of that material must still be removed. To do so, after a quick rinse step, the process of the present invention applies an amine-based dip to remove the remaining organic residues. Such a step cleans the wafer without significantly affecting the dielectric layer, because of its high selectivity for organic residues over the dielectric material. Preferably, a commercially available amine/HF based solution (e.g., an n-methyl-2-pyrrolidone base solution like those sold under the tradename XT-1100 by Ashland, Inc.) is used. The solution preferably should be applied for at least about 2 minutes, more preferably between about 2 minutes and about 20 minutes, and even more preferably between about 4 minutes and about 8 minutes. Because such a solution causes the wet etch process to occur at a relatively slow rate, it can be used to remove the remaining portions of sacrificial material 104, and other organic residues, in a reasonably controllable manner.

Sacrificial material 104 thus may be completely removed by combining a conventional photoresist ashing step with the above described wet etch cleaning steps. An alternative process for removing that material relies upon a relatively lengthy ash process (e.g., one that may last over 5 minutes) to oxidize the sacrificial material prior to applying a BOE dip. That alternative process, not manufacturable due to the required length of the ash process, may not remove all of the sacrificial material. In contrast, the process of the present invention enables a shorter ash step, which may be easily integrated into an overall manufacturing process, while also ensuring complete removal of the sacrificial material and any etch residue. The process of the present invention thus provides an improved cleaning capability that enables higher yields. Because increasing a via's aspect ratio and/or depth lowers the amount of oxidation that occurs when the photoresist is removed, the process of the present invention is particularly applicable to processes that form vias that are relatively deep and that have a relatively high aspect ratio.

Barrier layer 102 protects conductive layer 101 from exposure to the solvents and/or oxidizing environment used when cleaning the trench. After these cleaning steps, the portion of barrier layer 102 that separates via 107 from conductive layer 101 may be removed to expose conductive layer 101. A low polymer producing chemistry is preferably used to remove that portion of barrier layer 102, as is well understood by those skilled in the art.

Barrier layer 102 removal may be followed by a short wet etch (which employs an etch chemistry that is compatible with the material used to form conductive layer 101) to clear etch residue from the surface of conductive layer 101. When copper is used to make the conductive layers, that portion of barrier layer 102 should be removed, using a copper compatible chemistry, before any copper electroplating step is applied to fill via 107 and trench 106. Removal of barrier layer 102 produces the structure shown in FIG. 1g.

Following that barrier layer removal step, trench 106 and via 107 are filled with second conductive layer 105. Conductive layer 105 may comprise any of the materials identified above in connection with conductive layer 101. Conductive layer 105 may comprise the same conductive material as conductive layer 101, or may comprise a conductive material different from the material used to make conductive layer 101.

Conductive layer 105 preferably comprises copper, and is formed using a conventional copper electroplating process, in which a copper layer is formed on barrier and seed layers used to line trench 106 and via 107. The barrier layer may comprise a refractory material, such as titanium nitride, but may also include an insulating material, such as silicon nitride. Such an insulating barrier layer should be removed from the bottom of the via to allow conductive layer 105 to contact the underlying metal, as described in Ser. No. 163,847, filed Sep. 30, 1998 and assigned to this application's assignee. The barrier layer formed beneath conductive layer 105 preferably is between about 100 and 500 angstroms thick. Suitable seed materials for the deposition of copper include copper and nickel.

As with conductive layer 101, although copper is preferred, conductive layer 105 may be formed from various materials that can serve to conduct electricity within an integrated circuit. When an excess amount of the material used to make layer 105 is formed on the surface of dielectric layer 103, a CMP step may be applied to remove the excess material and to planarize the surface of layer 105. When an electroplating process is used to form conductive layer 105 from copper, that CMP step removes both the excess copper and the underlying barrier layer. When dielectric layer 103 comprises silicon dioxide, that layer provides a CMP stop layer for such a CMP step.

Figure 1F:
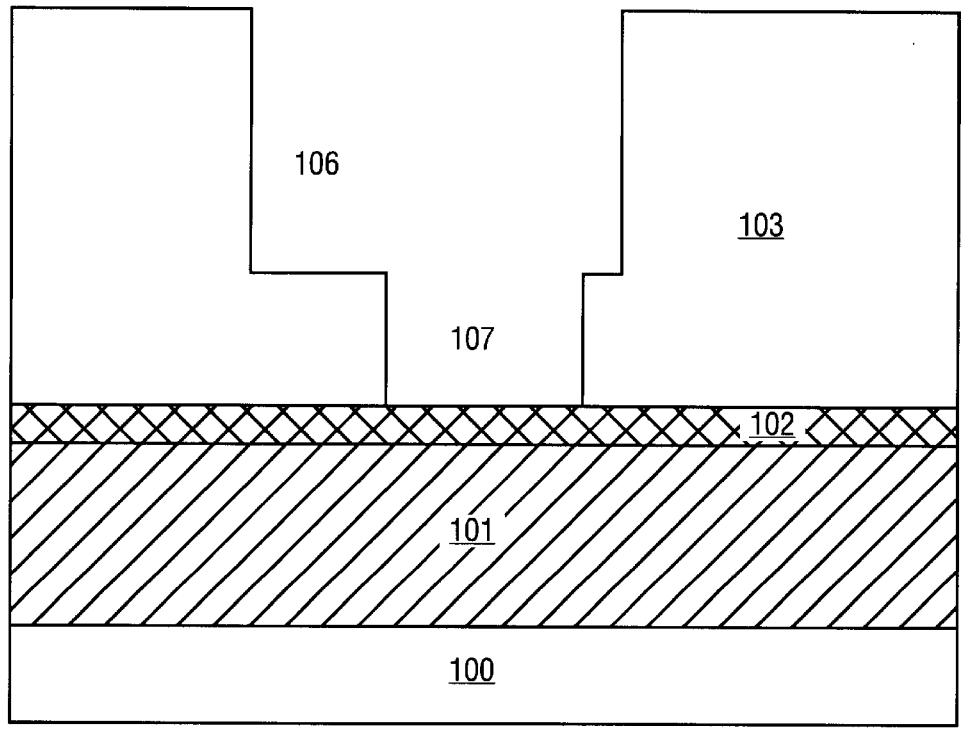
Figure 1G:
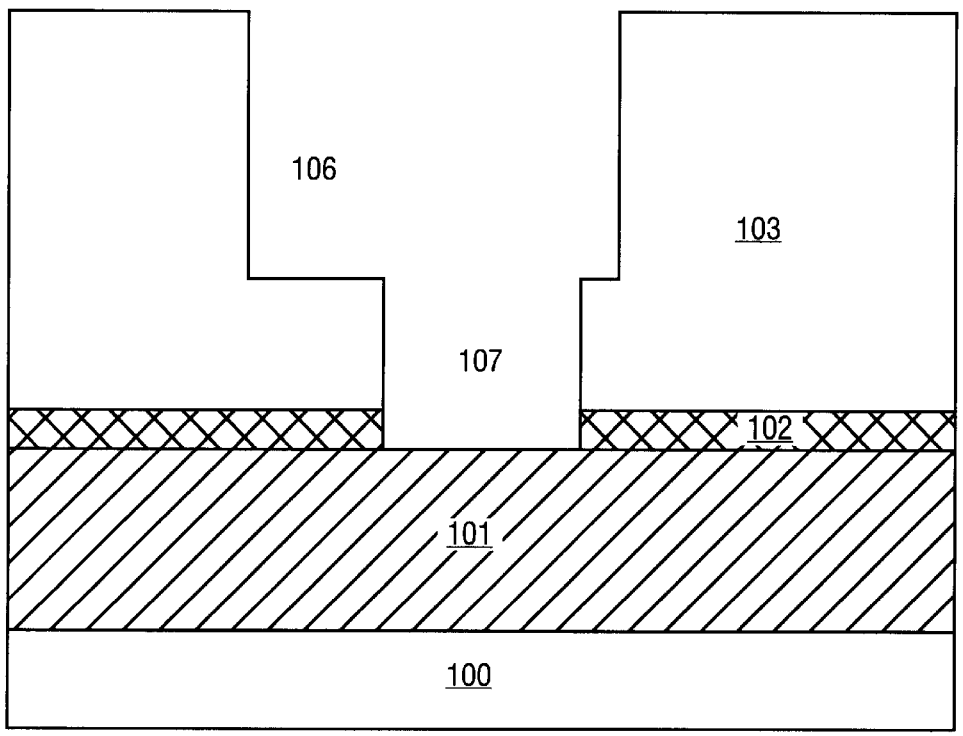
Figure 1H:
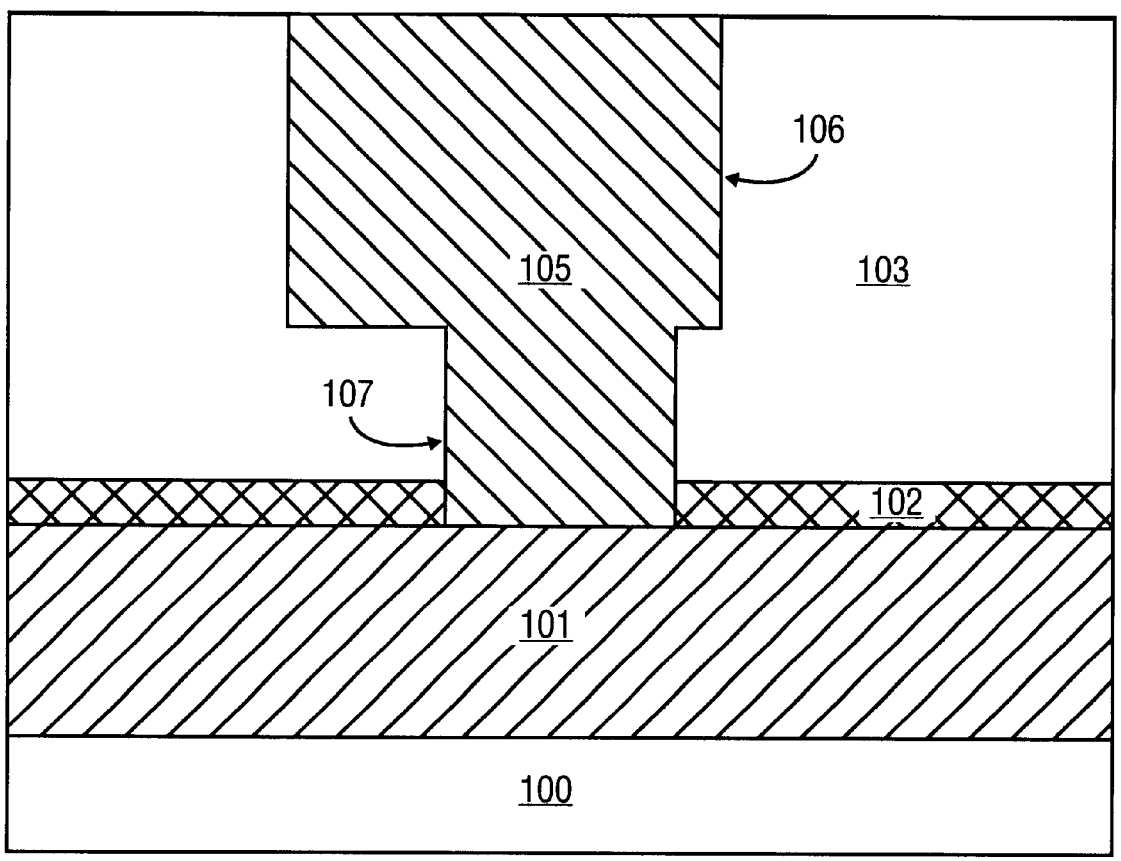

FIG. 1h shows the structure that results after filling trench 106 and via 107 with a conductive material, then applying a CMP step to remove excess material from the surface of layer 103 to produce conductive layer 105. Although the embodiment shown in FIG. 1h shows only one dielectric layer and two conductive layers, the process described above may be repeated to form additional conductive and insulating layers until the desired integrated circuit is produced.

Figure 2A:
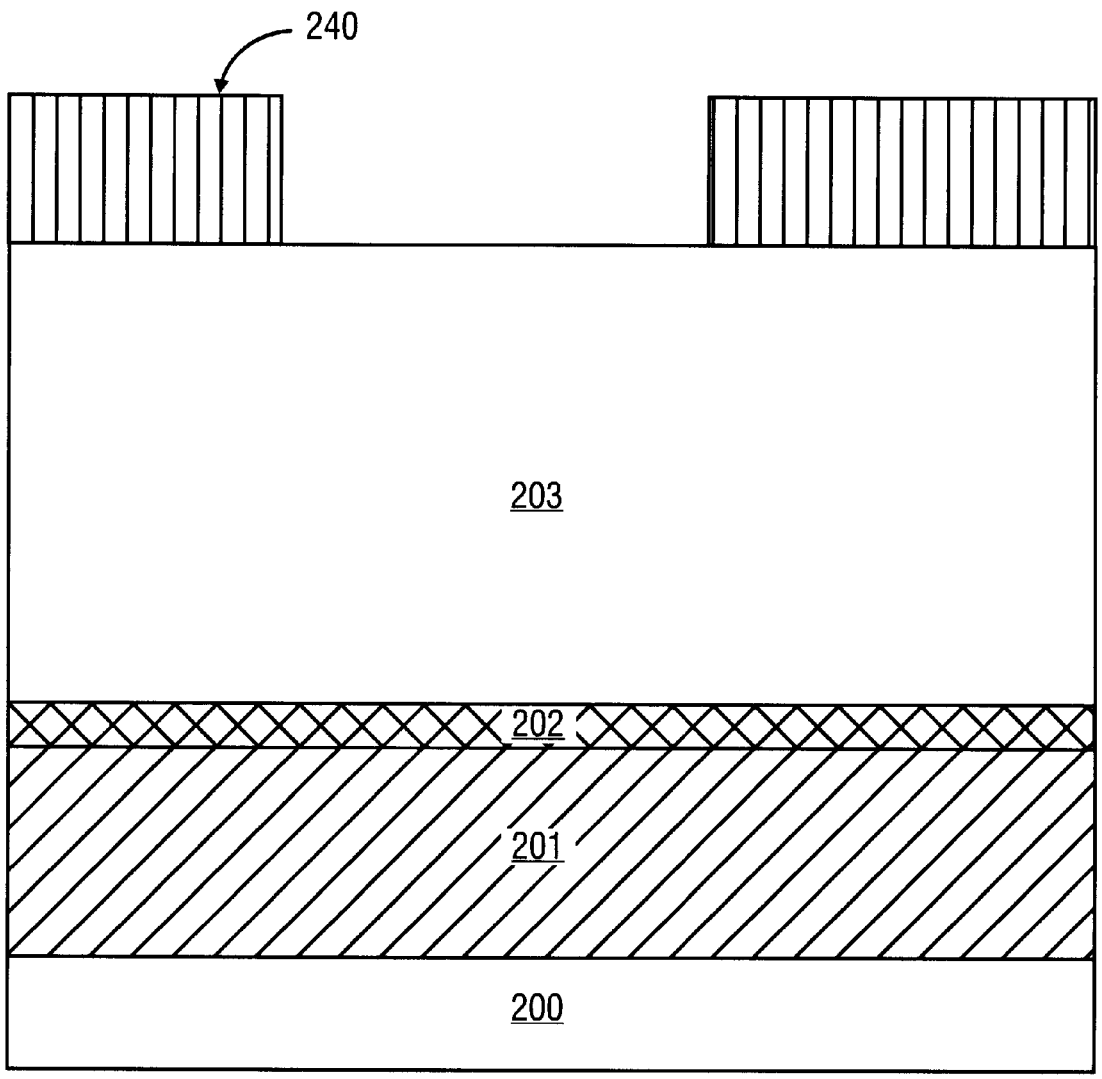
FIGS. 2a–2g illustrate cross-sections that reflect structures that may result after certain steps are used to make a copper containing dual damascene device following a second embodiment of the method of the present invention.
Figure 2B:
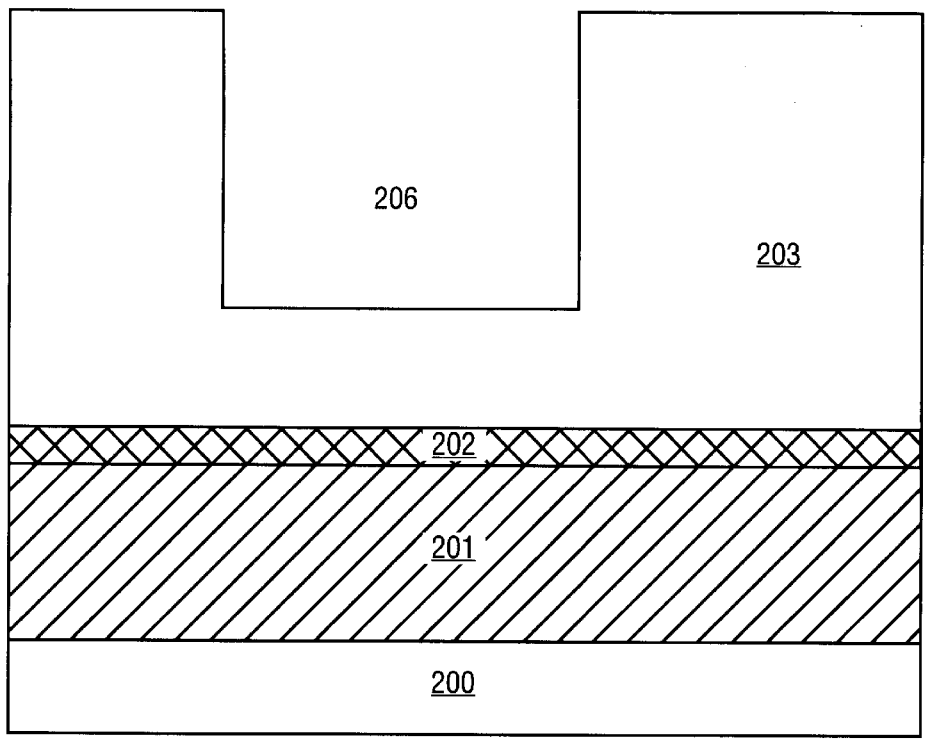
Figure 2C:
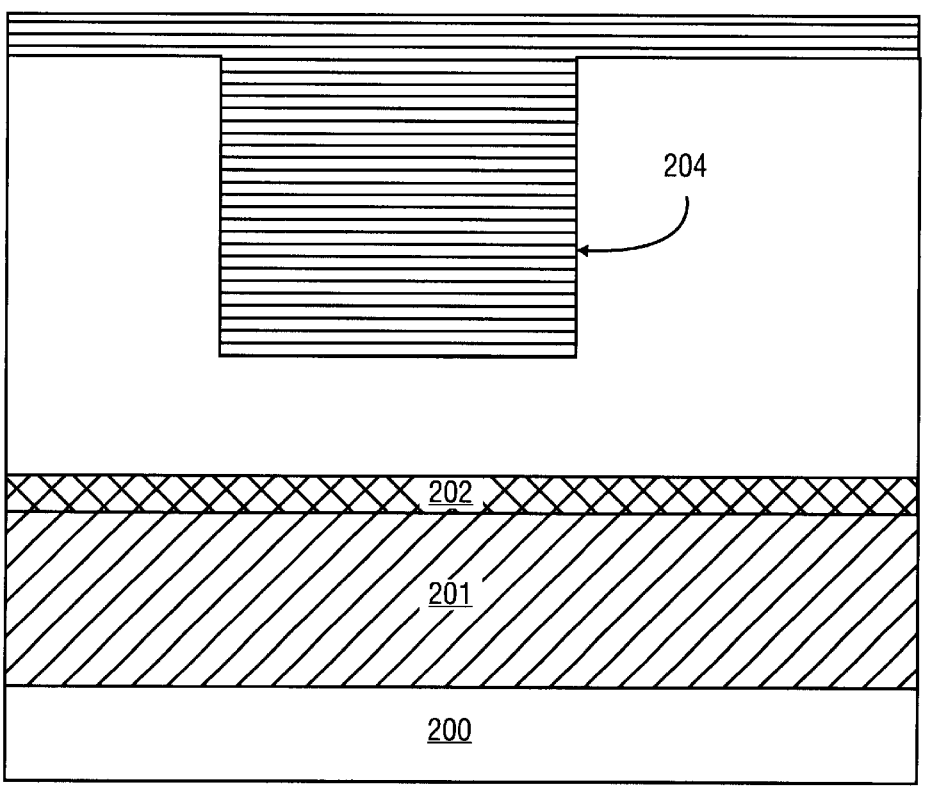
Figure 2D:
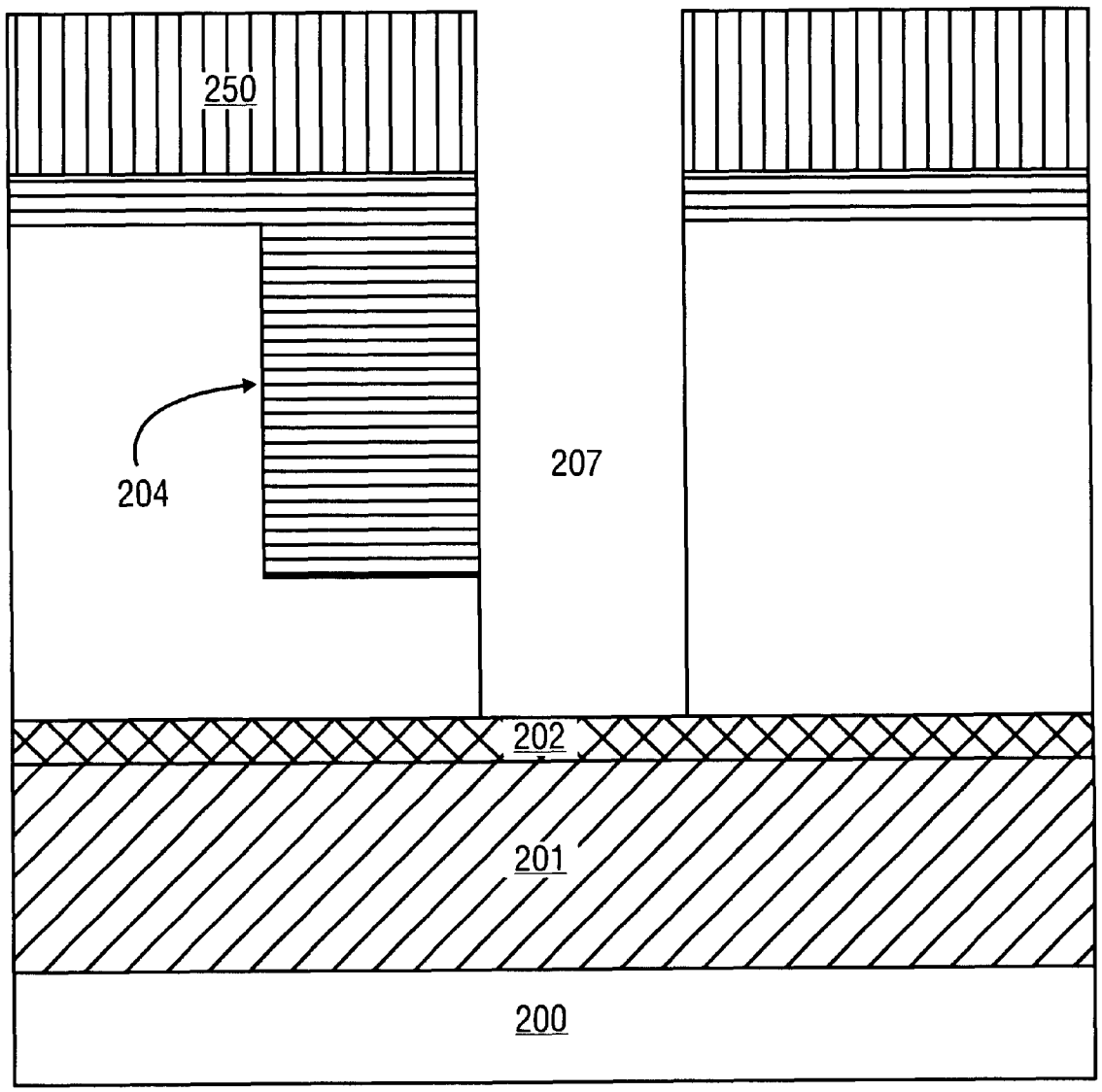

FIGS. 2a–2g represent structures that may be formed when applying a second embodiment of the method of the present invention. FIG. 2a shows a structure similar to the one shown in FIG. 1b, except that photoresist layer 240 is patterned to form the trench instead of the via. After that patterning step, dielectric layer 203 is etched to form trench 206, as shown in FIG. 2b. When dielectric layer 203 is made of silicon dioxide, the trench etch process may be performed using the medium density MERIE system referenced above.

The etching process is applied for a time sufficient to form a trench having the desired depth. Because the trench etch process does not etch completely through dielectric layer 203, barrier layer 202 is not exposed during that process. Because the barrier layer is not exposed, when etching the trench, the chemistry used to etch the trench need not ensure a high etch rate for dielectric layer 203, when compared to the etch rate for barrier layer 202. No longer constrained by that requirement, the trench etch process may be optimized to yield trenches having substantially vertical profiles, substantially flat bottom surfaces, and a more controllable depth, without regard for the selectivity that the chosen etch chemistry produces.

Following the trench etching step, conventional post etch ashing and cleaning steps are performed. Sacrificial material 204 is then applied to the device, e.g., by spin coating it onto the device's surface, which fills trench 206, generating the structure shown in FIG. 2c. As shown, sacrificial material 204 not only fills trench 206, but also creates a substantially planar surface for the subsequent lithographic definition of via 207.

After the trench fill step, photoresist layer 250 is patterned to define via 207. Via 207 is then etched by etching through the exposed portion of sacrificial material 204 and through the underlying portion of dielectric layer 203 to produce the structure shown in FIG. 2d. When dielectric layer 203 is made from silicon dioxide, and sacrificial material 204 is made from SOG, the same oxide etch system used to etch trench 206 may be used to etch via 207.

Other materials may be selected for dielectric layer 203 and sacrificial material 204, as long as the etch chemistry used to etch through those materials to form via 207 ensures removal of dielectric layer 203 and sacrificial material 204 at substantially the same rate. Barrier layer 202 will be etched only during a via overetch step, which may be necessary to account for variation in the thickness of dielectric layer 203.

Etching barrier layer 202 only during the via overetch step enables a significant reduction in the selectivity of dielectric layer 203 to barrier layer 202. By reducing that selectivity requirement, an etch chemistry optimized for making a substantially defect free device that has improved trench and via profiles may be used, instead of an etch chemistry that provides for high selectivity. In addition, because barrier layer 202 is etched for a relatively short time, i.e., only during the via overetch step, a layer that is less than about 600 angstroms thick, when initially deposited, may be used for making devices with improved dielectric properties.

Figure 2E:
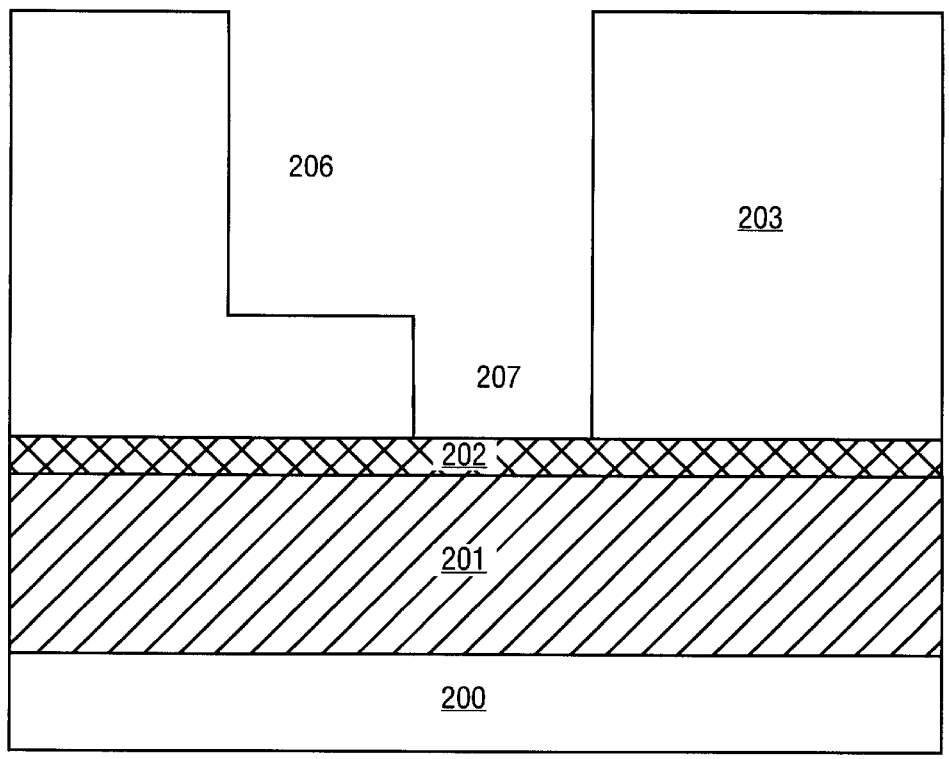

After the via etch step, photoresist layer 250 and the remaining sacrificial material 204 are removed, as are any residues that remain on the surface of the device or inside the vias. The same process described above, in connection with FIGS. 1a–1h, for cleaning the via and trench after the trench etch step may be applied here to clean the via and trench after the via etch step. That process, which comprises applying a conventional oxygen based ashing step followed by the BOE dip and amine/HF solution treatment described above, removes both the photoresist and the remaining sacrificial material from the surface of the device and from within trench 206 and via 207. The resulting structure is shown in FIG. 2e. Conductive layer 201 is protected from the potentially damaging effects of such a wet clean process by the remaining portion of barrier layer 202.

Although sacrificial material 204 preferably may be etched at substantially the same rate that dielectric layer 203 may be etched, when using a dry etch chemistry, sacrificial material 204 should etch at a significantly faster rate than dielectric layer 203 during this via clean process. That characteristic ensures that substantially all of sacrificial material 204 is removed during the via cleaning steps, without removing a substantial amount of dielectric layer 203.

Figure 2F:
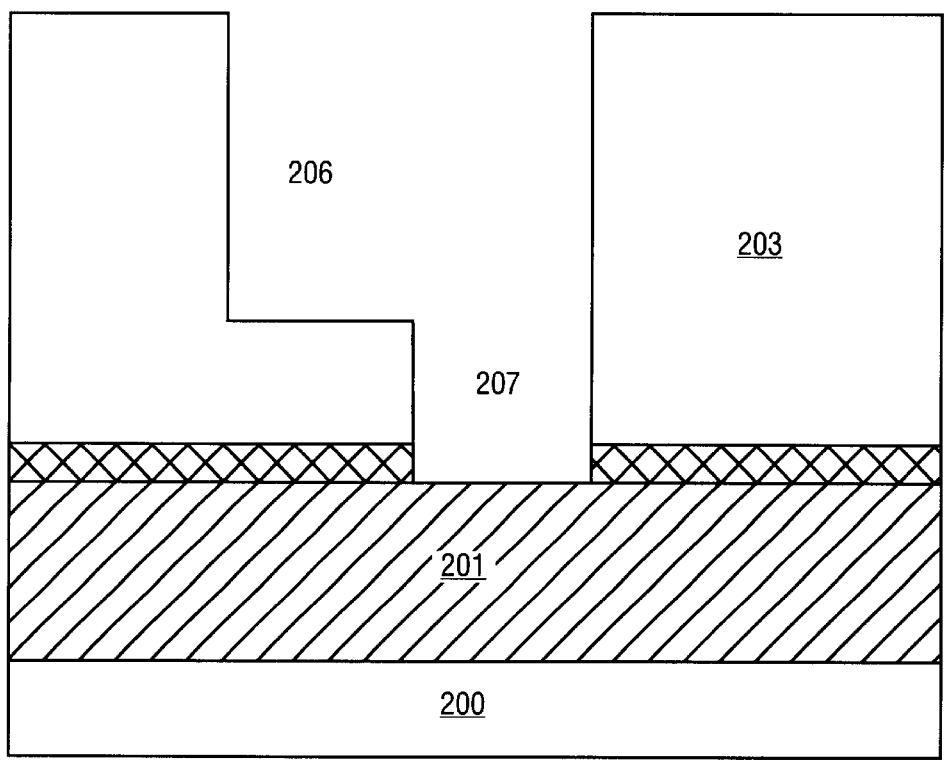
Figure 2G:
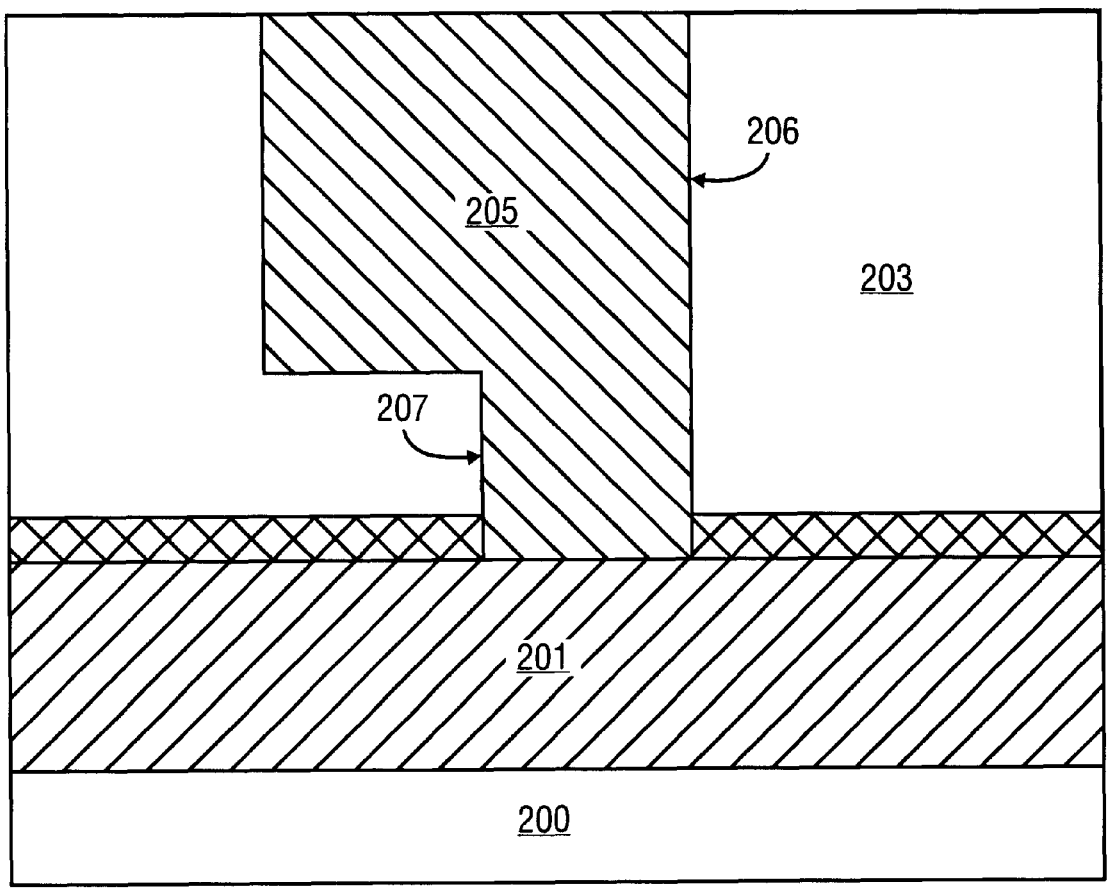

After the via clean step, the exposed portion of barrier layer 202, which preferably comprises silicon nitride, is etched—preferably using an etch chemistry that does not produce a significant amount of polymer. As mentioned above, in connection with the embodiment of the present invention described with reference to FIGS. 1a–1h, that barrier layer etch step may be followed by a short cleaning step that removes residue that may remain on the surface of conductive layer 201. The resulting structure is shown in FIG. 2f. Trench 206 and via 207 may then be filled with a conductive material, e.g., copper. Following any appropriate CMP step, the structure shown in FIG. 2g is created.

Figure 3A:
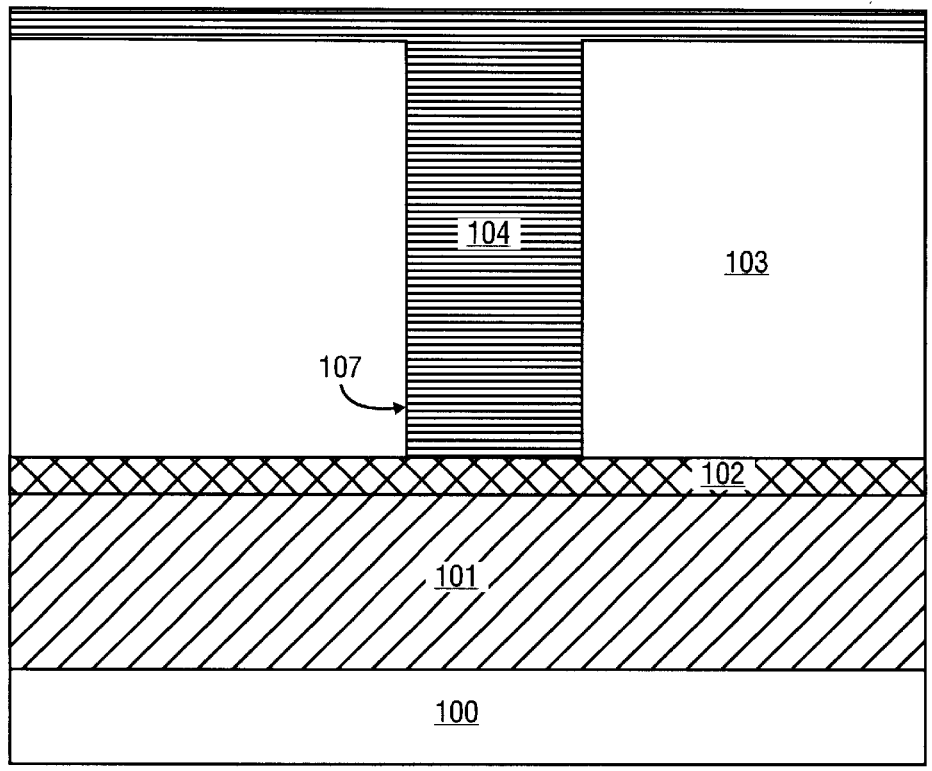
FIGS. 3a–3c illustrate cross-sections that reflect structures that may result after certain steps are used to make a copper containing dual damascene device following a third embodiment of the method of the present invention.
Figure 3B:
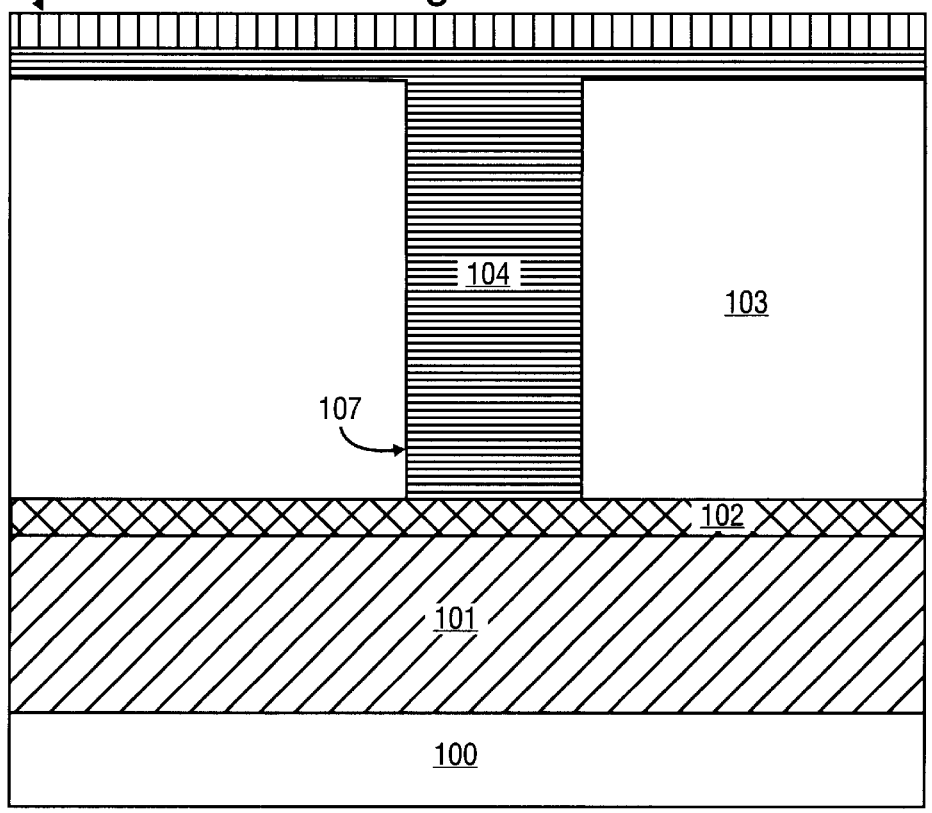
Figure 3C:
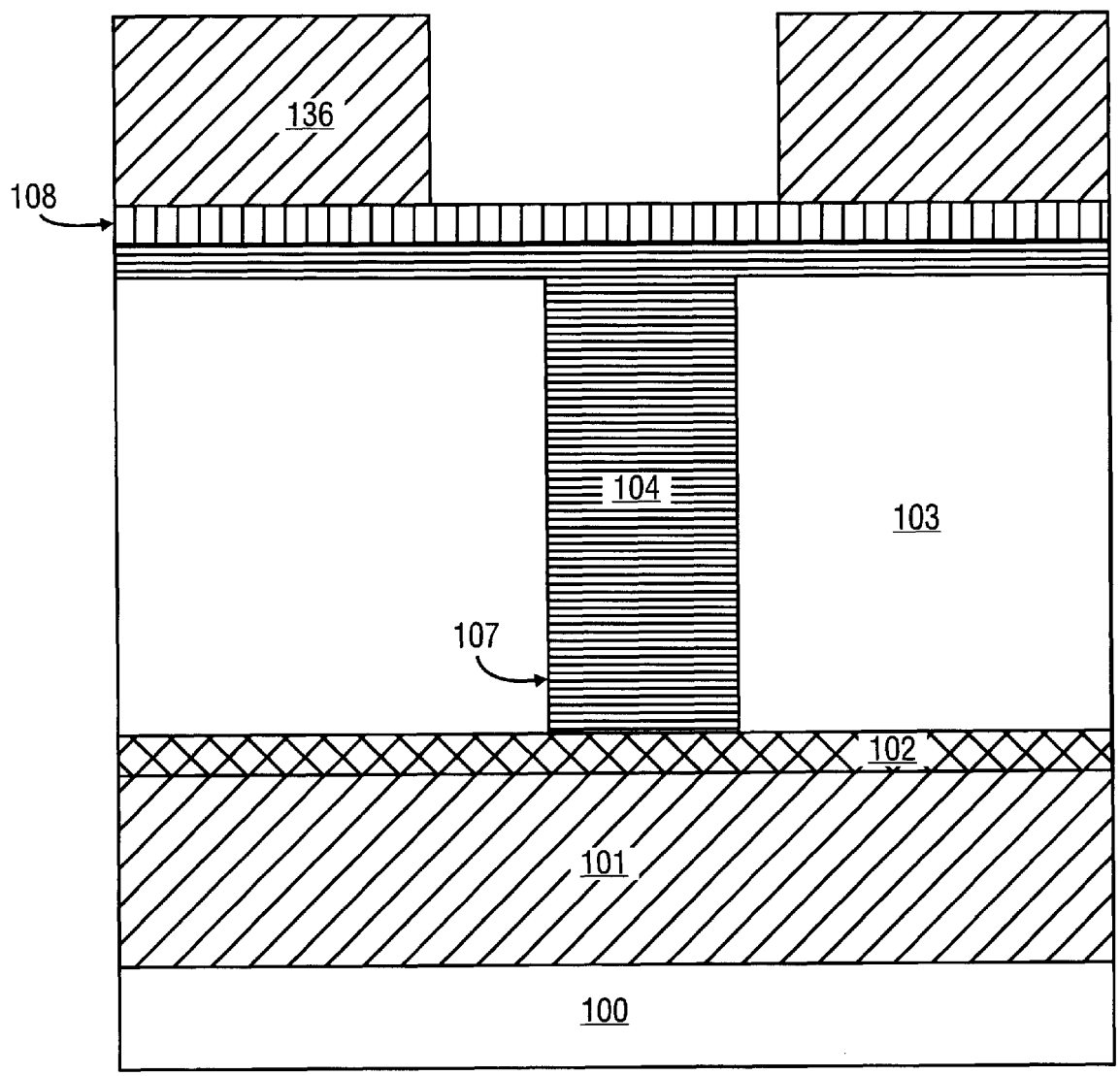

FIGS. 3a–3c illustrate a variation of the process described above in connection with FIGS. 1a–1h. In this variation, process steps specified above may be used to generate the structure shown in FIG. 3a. (Similar numbers are used in FIGS. 1a–1h and 3a–3c to represent similar structures.) In this variation, sacrificial material 104 may be transparent. As described above, sacrificial material 104 may comprise an SOG, which was spin coated onto dielectric layer 103, filling via 107 and covering dielectric layer 103. Because in this embodiment of the present invention an antireflective layer will be formed on sacrificial material 104, the SOG used to fill via 107 does not need to be a dyed material to reduce substrate reflectivity.

Antireflective layer 108 is formed on sacrificial material 104. In the resulting structure, represented by FIG. 3b, antireflective layer 108 preferably is between about 400 and about 1,000 angstroms thick. Antireflective layer 108 may comprise an organic or inorganic material. Suitable organic materials that may be used to produce a low reflectance substrate include commercially available bottom antireflective coatings ("BARCs"). Conventional spin coating techniques may be used to apply such materials to the surface of sacrificial material 104. Suitable inorganic materials include silicon nitride, silicon carbide, and titanium nitride. Such materials may be deposited onto the underlying layers using conventional chemical vapor deposition techniques (e.g., PECVD) that are generally known to those of ordinary skill in the art.

The material chosen for antireflective layer 108 should reduce reflection at the wavelength of light used in the subsequent photolithographic process employed to define the line/space pattern. Such a material will reduce (or perhaps eliminate) any adverse impact on CD control and uniformity that could result from the high substrate reflectivity that may be caused by exposing a transparent material during the lithographic process used to define the trench. In addition, that material should be removable from the wafer using a conventional photoresist removal or chemical etch process.

After forming antireflective layer 108, a layer of photoresist is applied, exposed and developed, using conventional photolithography steps, to produce the structure shown in FIG. 3c, in which photoresist layer 136 defines the trench. After those lithographic steps, the trench is etched as follows. Initially, the exposed portion of antireflective layer 108 is removed. When layer 108 comprises a BARC material, layer 108 may be removed using a process like that conventionally used to remove photoresist. (Although such a process may remove part of photoresist layer 136 at the same time, the amount of photoresist removed will not affect subsequent lithographic steps.) When antireflective layer 108 comprises an inorganic material, the exposed portion of that layer may be removed using conventional selective (to dielectric layer 103) etch chemistry and processes for removing such materials. After removing that portion of layer 108, dielectric layer 103 and sacrificial material 104 are etched to create the trench, using the process steps described above in connection with FIGS. 1e and 1f.

After the trench is etched, the photoresist is removed, e.g., by using a conventional photoresist ashing step. When layer 108 comprises a BARC material, the remaining portion of that layer may be removed at the same time the photoresist is removed. When layer 108 comprises an inorganic material, the remaining portion of that layer may be removed using the same chemistry and process that had been used to remove the exposed portion of layer 108 prior to etching the trench.

Following the photoresist and antireflective layer removal steps, those portions of sacrificial material 104 that remained after the trench was etched are removed, as are any dry etch residues, to produce the structure shown in FIG. 1f. As described above, because an oxygen based ash step only oxidizes part of the sacrificial material, the wet etch clean process applies two steps—the first applying a conventional BOE dip to remove the oxidized portion of the sacrificial material, and the second applying an amine/HF based solution to remove the remaining unoxidized portion.

After these photoresist removal and via and trench cleaning steps, subsequent processing follows, as described above, to generate the structure shown in FIG. 1h. Although this variation of the method of the present invention has been described in the context of a process that forms the via before the trench (like the process shown in FIGS. 1a–1h), this variation may similarly be applied to processes that form the trench before the via (like the process shown in FIGS. 2a–2g).

The improved method for making a semiconductor device of the present invention enables improved lithography and the use of etch chemistry that provides for a lesser degree of silicon dioxide to silicon nitride selectivity than may otherwise be required. Such a method enables improved line and spacing definition and enables a thinner silicon nitride layer to adequately protect the surface of the underlying conductive layer. It also promotes superior via and trench profiles. That process is enhanced by using a two step cleaning process, comprising a BOE dip followed by a dip in an amine based solution, that enables a conventional oxygen based ashing step to remove photoresist while ensuring that the remaining sacrificial material, and organic residues, are also removed.

Although the foregoing description has specified certain steps, materials, and equipment that may be used in such a method to make such a semiconductor device, those skilled in the art will appreciate that many modifications and substitutions may be made. Accordingly, it is intended that all such modifications, alterations, substitutions and additions be considered to fall within the spirit and scope of the invention as defined by the appended claims.

What is claimed is:

1. A method of forming a semiconductor device comprising:

forming a conductive layer on a substrate;

forming a dielectric layer on the conductive layer;

forming a first etched region by removing a first portion of the dielectric layer;

filling the first etched region with a sacrificial material;

patterning a photoresist layer to define a second region to be etched;

forming a second etched region by removing a substantial portion of the sacrificial material and a second portion of the dielectric layer;

removing the photoresist layer; then cleaning the first and second etched regions by:

applying a buffered oxide etch dip to remove a significant portion of the remaining sacrificial material; and applying an amine based dip to remove substantially all of the residues that remain within the first and second etched regions after the buffered oxide etch dip.

2. The method of claim 1 wherein the photoresist layer is removed by applying an oxygen based ashing step for less than about 2 minutes;

the buffered oxide etch dip is applied for greater than about 30 seconds; and the amine based dip is applied for greater than about 2 minutes.

3. The method of claim 2 wherein the oxygen based ashing step is applied for less than about 90 seconds;

the buffered oxide etch dip is applied for between about 2 minutes and about 3 minutes; and the amine based dip is applied for between about 2 minutes and 45 about 20 minutes.

4. The method of claim 3 wherein the sacrificial material comprises a dyed spin-on-glass ("SOG") and the dielectric layer comprises a material selected from the group consisting of silicon dioxide, fluorinated silicon dioxide and carbon doped silicon dioxide.

5. The method of claim 4 wherein the SOG material etches, under dry etch conditions, at a faster rate than the silicon dioxide layer.

6. A method of forming a semiconductor device having a dual damascene interconnect comprising:

forming a first conductive layer on a substrate;

forming a dielectric layer on the conductive layer;

patterning a first layer of photoresist, after forming the dielectric layer, to define a via;

forming a via through a first portion of the dielectric layer;

filling the via with a dyed SOG material;

patterning a second layer of photoresist to define a trench;

forming a trench within the dielectric layer by removing a substantial portion of the SOG material and a second portion of the dielectric layer;

removing the second layer of photoresist by applying an oxygen based ashing step for less than about 2 minutes; then cleaning the via and trench by:

applying a buffered oxide etch dip for greater than about 30 seconds to remove a significant portion of the remaining SOG material; and applying an amine based dip for greater than about 2 minutes to remove substantially all of the residues that remain within the via and trench after the buffered oxide etch dip; and then filling the via and trench with a second conductive layer.

7. The method of claim 6 wherein the oxygen based ashing step is applied for less than about 90 seconds;

the buffered oxide etch dip is applied for between about 2 minutes and about 3 minutes; and the amine based dip is applied for between about 2 minutes and about 20 minutes.

8. The method of claim 7 wherein the dielectric layer comprises a material selected from the group consisting of silicon dioxide, fluorinated silicon dioxide and carbon doped silicon dioxide, and the first and second conductive layers comprise copper.

9. The method of claim 8 wherein the SOG material etches, under dry etch conditions, at a faster rate than the silicon dioxide layer.

10. A method of forming a semiconductor device having a dual damascene interconnect comprising:

forming a first conductive layer on a substrate;

forming a dielectric layer on the conductive layer;

patterning a first layer of photoresist, after forming the dielectric layer, to define a trench;

forming a trench within a first portion of the dielectric layer;

filling the trench with a dyed SOG material;

patterning a second layer of photoresist to define a via;

forming a via through the dielectric layer by removing a substantial portion of the SOG material and a second portion of the dielectric layer;

removing the second layer of photoresist by applying an oxygen based ashing step for less than about 2 minutes; then cleaning the trench and via by:

applying a buffered oxide etch dip for greater than about 30 seconds to remove a significant portion of the remaining SOG material; and applying an amine based dip for greater than about 2 minutes to remove substantially all of the residues that remain within the trench and via after the buffered oxide etch dip; and then filling the via and trench with a second conductive layer.

11. The method of claim 10, wherein the dielectric layer comprises a material selected from the group consisting of silicon dioxide, fluorinated silicon dioxide and carbon doped silicon dioxide, and the first and second conductive layers comprise copper, and wherein the SOG material etches, under dry etch conditions, at a faster rate than the dielectric layer.

12. A method of forming a semiconductor device comprising:

forming a conductive layer on a substrate;

forming a dielectric layer on the conductive layer;

forming a first etched region by removing a first portion of the dielectric layer;

filling the first etched region with a sacrificial material having dry etch properties similar to those of the dielectric layer;

forming an antireflective layer on the sacrificial material;

patterning a layer of photoresist, after forming the antireflective layer, to define a second region to be etched;

forming a second etched region by removing the antireflective layer, a substantial portion of the sacrificial material and a second portion of the dielectric layer;

removing the second layer of photoresist by applying an oxygen based ashing step for less than about 2 minutes; then cleaning the first and second etched regions by:

applying a buffered oxide etch dip for greater than about 30 seconds to remove a significant portion of the remaining sacrificial material; and applying an amine based dip for greater than about 2 minutes to remove substantially all of the residues that remain within the first and second etched regions after the buffered oxide etch dip; and then filling the first and second etched regions with a second conductive layer.

13. The method of claim 12 wherein the sacrificial material is an SOG material.

14. The method of claim 13 wherein the dielectric layer comprises a material selected from the group consisting of silicon dioxide, fluorinated silicon dioxide and carbon doped silicon dioxide, and the first and second conductive layers comprise copper, and wherein the SOG material etches, under dry etch conditions, at a faster rate than the dielectric layer.

15. The method of claim 14 wherein the semiconductor device will include a dual damascene interconnect, and wherein the first etched region forms the via for the interconnect and the second etched region forms the trench for the interconnect.

16. The method of claim 14 wherein the semiconductor device will include a dual damascene interconnect, and wherein the first etched region forms the trench for the interconnect and the second etched region forms the via for the interconnect.

17. The method of claim 14 wherein the antireflective layer is between about 400 and about 1,000 angstroms thick and comprises a material selected from the group consisting of an organic bottom antireflective coating, silicon nitride, silicon carbide, and titanium nitride.

* * * * *